United States Patent [19]

Damon et al.

[11] 3,825,876

[45] July 23, 1974

[54] ELECTRICAL COMPONENT MOUNTING

[75] Inventors: Neil F. Damon, Cumberland, R.I.; Robert S. Laurence, Attleboro; Ralph C. Hoy, East Falmouth, both of Mass.

[73] Assignee: Augat Inc., Attleboro, Mass.

[22] Filed: Aug. 12, 1971

[21] Appl. No.: 171,217

[52] U.S. Cl. ......... 339/17 CF, 174/DIG. 3, 206/1 R, 317/101 CC, 339/174

[51] Int. Cl. ............................................. H05k 3/32

[58] Field of Search ....................... 174/DIG. 3, 525; 317/101 CC, 101 CP, 101; 339/17 CF, 174, 186, 65, 66, 126, 17, 176 R, 176 M; 206/46 ED, 65 F, 1 R; 324/158 T, 158 F

[56] References Cited

UNITED STATES PATENTS

| | | | |
|---|---|---|---|
| 2,648,031 | 8/1953 | Lang et al. | 317/101 R |
| 3,311,790 | 3/1967 | Vizzier, Sr. et al. | 317/101 CC X |
| 3,345,541 | 10/1967 | Cobaugh et al. | 317/101 CC |
| 3,434,687 | 3/1969 | Boyer | 339/17 R |
| 3,447,040 | 5/1969 | Denton | 317/101 CC |
| 3,605,062 | 9/1971 | Tinkelenberg | 317/101 CC |

FOREIGN PATENTS OR APPLICATIONS

| | | | |
|---|---|---|---|
| 1,102,711 | 9/1963 | Great Britain | 174/138.5 |
| 1,152,765 | 5/1969 | Great Britain | 339/17 CF |

OTHER PUBLICATIONS

IBM Tech. Bull. "Joining Dip Modules to Printed Circuit Card", Morgan et al. Vol. 11, No. 7, 12-68.

*Primary Examiner*—D. L. Clay
*Attorney, Agent, or Firm*—Weingarten, Maxham & Schurgin

[57] ABSTRACT

An electronic component mounting system particularly adapted for the economical high density packaging of integrated circuits selectively in readily removable or soldered permanent attachment. Each integrated circuit component is rigidly attached to a complementary cartridge of insulated material and the assembled structure may be inserted in either normal or inverted position within terminals correspondingly arrayed on a mounting panel. In one position the assembly may be plugged in and snapped out as required, while in inverted position the individual leads of the integrated circuit may be soldered to respective terminals. Each of the mounting panel terminals is provided with a wire wrapping pin extension and the spacing of the pins remains as in prior systems, enabling the use of existing wire wrap programs without change.

10 Claims, 9 Drawing Figures

ELECTRICAL COMPONENT MOUNTING

FIELD OF THE INVENTION

The present invention relates in general to arrangements for packaging integrated circuits and their attachment to mounting panels, and more particularly concerns an integrated circuit cartridge and novel complementary mounting panel terminals adapted to provide exceedingly economical means for connection of integrated circuits selectively in readily removable or permanent soldered attachment. The cartridge and terminal structures and techniques of the present invention will be seen to have broad application in the art, but for convenience and clarity these will be described herein as adapted specifically for use with an integrated circuit housed in a package commonly identified as a "dual-in-line package" or briefly a "DIP".

BACKGROUND OF THE INVENTION

Integrated circuits in their most common configuration are contained within insulated housings known in the art as dual-in-line (DIP) packages. Broadly speaking, each such package consists of a relatively flat rectangular plastic, ceramic or like housing (hereinafter referred to simply as "plastic housing") which encapsulates the solid state electronic element, and two parallel rows of thin, ribbon-like conductive leads which extend respectively from the two longer edges of the housing. Each of the leads as it emerges from the package is turned at right angles of the flat plane of the plastic housing.

Heretofore several techniques have been evolved and standardized for mounting and electrically connecting DIP's into electronic circuits. In one arrangement that has received widespread acceptance for quality and reliability, the DIP has been attached to a printed circuit mounting panel simply by plugging it into an array of hollow cylindrical lead sockets aligned on the board to receive the respective array of integrated circuit leads. For example, if the DIP contained fourteen leads in two parallel rows, a corresponding number of conductive lead sockets were mounted on the circuit board to removably receive the DIP. In customary high density packaging, large numbers of integrated circuits are mounted upon a single panel and for ease and economy in wiring, each of the lead sockets of the type described is provided with an integral elongated wire wrap terminal which extends outward of the circuit board on the side opposite the lead socket opening. Certain mechanical and dimensional standards have been developed in the electronic industry for DIP terminal spacing, and this has facilitated the development of automatic and semi-automatic machines for wire wrapping the terminals to provide the desired electrical interconnections.

While the lead socket has been established as an exceedingly useful and reliable means for detachably receiving integrated circuits and has greatly facilitated the service and maintenance of equipment embodying huge numbers of integrated circuits, certain limitations have been apparent particularly to high volume users of lead socket panel boards. Most significantly, each lead socket is an individually machined component, often containing more than one metallic element which, by virtue of small size, requires tedious and expensive manual handling or, as an alternative, exceedingly complex and costly automatic machinery. Efforts have been made to reduce costs of lead socket manufacture, but these have often been accompanied by a corresponding sacrifice of reliability which in large scale computing machinery is intolerable due to the high monetary value of "down time".

Since unreliability is almost always due to imperfect and improper electrical contact, a recognized alternative has been the soldered connection, that is to say, an arrangement whereby each of the integrated circuit leads is permanently soldered to a less expensive mounting board terminal. For simpler circuits it is possible to solder integrated circuits to printed circuit wiring boards in the manner of individual components such as transistors and resistors. As complexity increases, however, the planar circuit board fails to provide sufficient wiring capacity and the wire wrap terminal is essential, as for the lead socket noted above. Thus, systems have been devised which accept integrated circuits for soldered connection and still provide the desired wire wrap facility. For a typical prior example of the latter technique, reference is made to U.S. Pat. No. 3,461,552 which illustrates a printed circuit board utilizing pins with wire wrap terminals instead of lead sockets. In the course of assembly, the upper face of the integrated circuit plastic package is placed against the mounting panel with each individual lead extending away from the board, but in contact with a respective one of the pins in the array. Thereafter, the assembly of pins and abutting integrated circuit leads is wave soldered to provide good mechanical and electrical connection. On the reverse side wire wrap connections are made as required.

While useful in some applications, this prior permanent solder technique has certain recognized limitations such as the difficulty encountered in inserting and mechanically retaining each of the integrated circuits in fixed position prior to the wave soldering operation. Also to accommodate the integrated circuit between the pins, the integral wire wrap terminals are no longer disposed at spacings established as standard in the industry.

Perhaps most significant is that the prior mounting means for integrated circuits are inflexible in that they fail to provide a choice to the user. Panels intended for pluggable removable use cannot be used conveniently for solder connection and conversely solder connection panels are of no use when removable plug-in connection is desired.

Additional background patents of interest are U.S. Pat. Nos. 3,267,335; 3,297,974; 3,335,327; 3,345,541; 3,377,514; 3,407,925; 3,434,687; 3,441,853; 3,605,062 and 3,644,792.

SUMMARY OF THE INVENTION

With the foregoing limitations of prior techniques in view, the present invention contemplates and has a primary object the provision of simplified, economical cartridge and integrated circuit assembly together with panel terminal structures permitting either plug-in or permanent solder mounting and interconnection of integrated circuits at the user's option which is exercised merely by selection of the position of the assembled cartridge and integrated circuit at the time of insertion in the terminal array. More specifically, in accordance with the principles of the invention, a small precision molded integral cartridge of durable insulative plastic serves as a carrier for each integrated circuit package and a novel conductive terminal element permits the assembly of integrated circuit and cartridge to be conveniently attached in either of two positions, normal or inverted, upon the mounting panel, one of which conveniently permits rapid assembly simply by plug-in and snap-out withdrawal as required for maintenance and service, while the other with comparable convenience permits permanent attachment by customary manual or automatic soldering procedures. The novel cartridge itself may be inexpensively molded in large quantity in relatively low cost plastic molding dies, and is shaped to provide a relatively large "target" insertion area to facilitate attachment of an integrated circuit, the leads of which are then preferably crimped in a single operation to form a unitary cartridge and integrated circuit assembly. Of special advantage, the cartridge will accept and accommodate the integrated circuits of various manufacturers notwithstanding differences in lead widths and thicknesses, and differences in housing dimensions. When assembled, the cartridge serves to enclose the delicate leads of the integrated circuit enabling shipment in bulk without further protection.

On the component side of the mounting panel, the novel terminals are cooperatively arranged to receive and retain the assembly of the integrated circuit and its respective cartridge in either normal or inverted position, the first permitting plugin insertion with excellent mechanical retention and positive electrical contacts for reliable operation and rapid, snap-out withdrawal when required; thee other providing good electrical and mechanical contact while permitting permanent soldered installation. In the latter position, as will be seen, good electrical contact is provided on insertion so that each component may first be tested electrically and defective units replaced before soldering. During the actual soldering procedure, the cartridge serves as a heat shield and protects the electronic element against excess temperature rise. Each terminal is formed with an integral elongated wire wrap terminal extending outwardly from the opposite side of the mounting panel.

A feature of the present invention is that all components thereof are especially adapted to meet the criteria for handling on automatic assembly machinery. The novel cartridge is shaped for machine attachment of the respective integrated circuit, and the terminals are in turn arranged to receive the integrated circuit and cartridge assemblies by machine. Of further advantage, the configuration of each terminal is such that while accepting the integrated circuit and cartridge assembly for either removable or permanent attachment, an offset is provided whereby the resulting array of wire wrap leads remains precisely the same as when used with the predecessor lead sockets, thus enabling use of existing automatic or semi-automatic wire wrapping machines without program change.

As will become evident, the present invention offers specific advantages not only to the integrated circuit user, but to the integrated circuit manufacturer as well. These will be seen to include marked cost reductions incomponent packaging for shipment and ease of electrical testing. As to both component manufacturer and user, the economies permitted by the invention are available with enhanced system flexibility and overall reliablity.

BRIEF DESCRIPTION OF THE DRAWING

The foregoing and other objects and advantages of the present invention will now become apparent from the following specification when read in conjunction with the accompanying drawing in which.

DETAILED DESCRIPTION OF PREFERRED EMBODIMENTS

Figures 1, 2, 3:
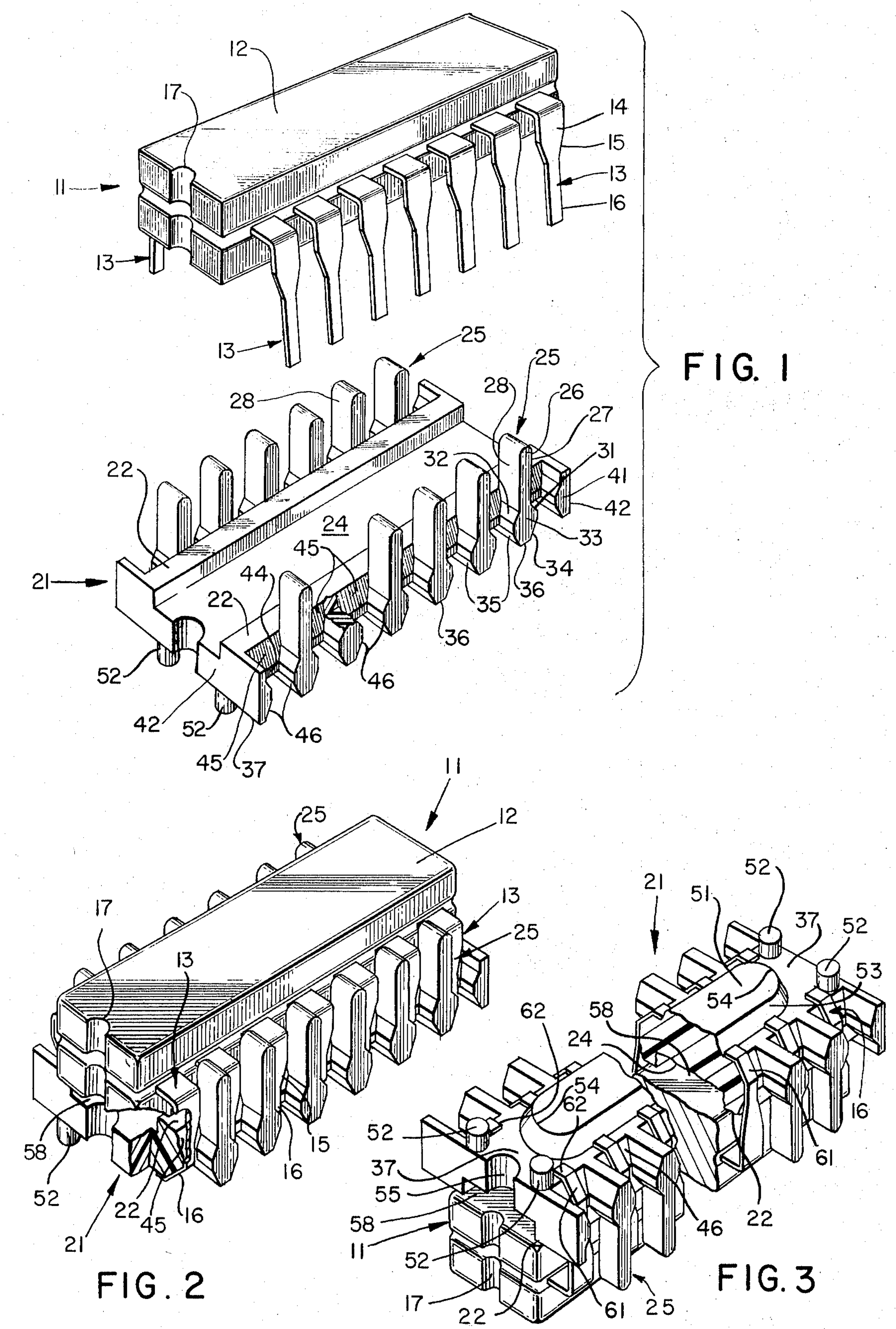
FIG. 1 is an exploded perspective view, partly broken away, of the novel integrated circuit mounting cartridge of the present invention in association with a spaced dual-in-line package (DIP) integrated circuit.
FIG. 2 is a perspective view of the integrated circuit mounting cartridge and integrated circuit package shown in FIG. 1 with these two elements joined together in accordance with the present invention.
FIG. 3 is a perspective view, partially broken away, to illustrate certain sections of the assembly shown in FIG. 2 with the assembled components inverted to reveal the opposite faces thereof.

In order to facilitate an understanding of the structural details and advantages of the present invention, it is believed appropriate to introduce the subject with a brief description of the general physical characteristics of a customary dual-in-line (DIP) integrated circuit package. Thus, with reference now to the drawings and more particularly to FIG. 1, the DIP 11 is seen to comprise a rectangular, molded plastic housing 12 enclosing the active solid state electronic component (not shown) which has its various active electrical circuits arranged for external connection through a pair of parallel rows of ribbon-like conductive leads 13 each of which extends outwardly from a respective side edge of the housing and is then turned at right angles in the manner shown.

Each of the leads 13 includes a relatively wide section 14 which tapers symmetrically at 15 to a narrower lead extension 16. The number of leads is dependent upon the nature of the electrical component contained within the housing 12, and for illustrative purposes a typical fourteen lead integrated circuit DIP has been shown in the drawing. The housing 12 is itself symmetrical except for a polarizing notch 17 which is employed during assembly to orient the component appropriately before insertion in a panel.

Although different manufacturers of integrated circuits may utilize slightly different configurations and employ different tolerances, a substantial degree of standardization has occurred in the electronic industry. For example, in a common configuration the transverse spacing between centers of the ribbon-like leads 13 is 0.300 inch while the center-to-center spacing between the leads along any one edge of the integrated circuit is 0.100 inch. Mounting panels for receiving such integrated circuits have thus to a large extent been arraged with wire wrap terminals spaced to correspond on the basis of a 0.100 inch grid, and automatic and semiautomatic wire wrapping machines for wiring appropriate leads on the panel on the side opposite the integrated circuits have been developed to accommodate these dimensional standards. As will be evident from the discussion which follows, the novel integrated circuit mounting techniques herein disclosed and the associated panels may advantageously employ the identical dimensional specifications and permit the continued use of available automatic and semi-automatic wire wrapping machinery for system wiring without change.

More specifically, in accordance with the principles of this invention, each integrated circuit package is provided with a corresponding mating unitary mounting cartridge which is preferably precision molded in one piece of durable but relatively low cost insulative plastic. With further reference to FIG. 1, the novel cartridge 21 consists of an axially symmetric single generally rectangular plastic molding of a body portion with a pair of stepped shoulder portions 22-22 spaced about a central portion 24 of reduced thickness, and an array of upstanding uniformly spaced identical posts 25 defining a series of generally parallel slots along both side edges thereof. One of the posts 25 has been broken away in FIG. 1 to reveal certain structural details, to be described.

The nature of posts 25 will now be considered more specifically with reference to FIGS. 1, 2, 3, 7 and 8 of the drawing. As illustrated, the upper portion of each of posts 25 is smoothly rounded at 26, from which the respective post extends downwardly between parallel side walls 27 and 28. Continuing downward, each post 25 flares outwardly between flat angular faces 31 and 32 to a small straight section 33 of maximum width. Below section 33 each post tapers inwardly between flat walls 34 and 35, and terminates in a flat lower face 36, with all such faces 36 lying in planar lower surface 37, shown best in the inverted view, FIG. 3.

The four outer corners of cartridge 21 are each terminated by an outwardly extending lug 41 which has a flat outer surface 42 and an inner surface which conforms generally, over its shorter length, to the confronting inner face of the adjacent post 25.

Figure 7:
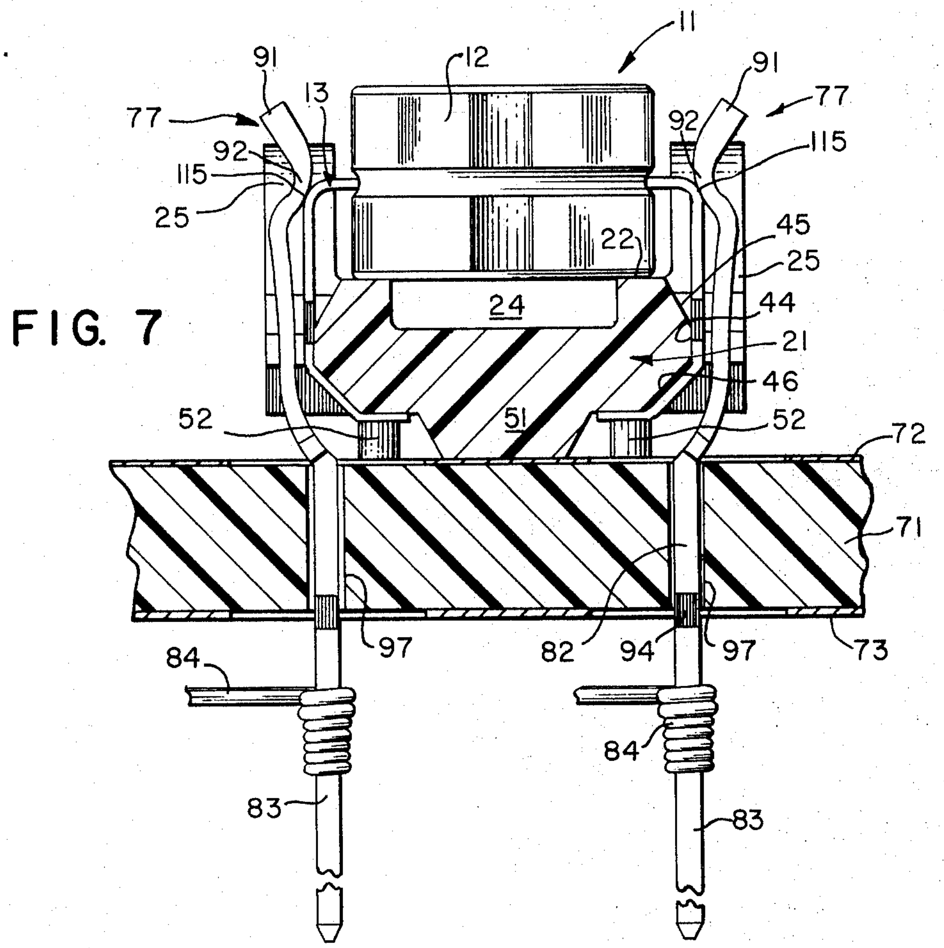
FIG. 7 is a cross-sectional view of the cartridge and attached integrated circuit component taken along the plane 7—7 of FIG. 6 (the integrated circuit itself which forms no part of the present invention has not been shown in section)
Figure 8:
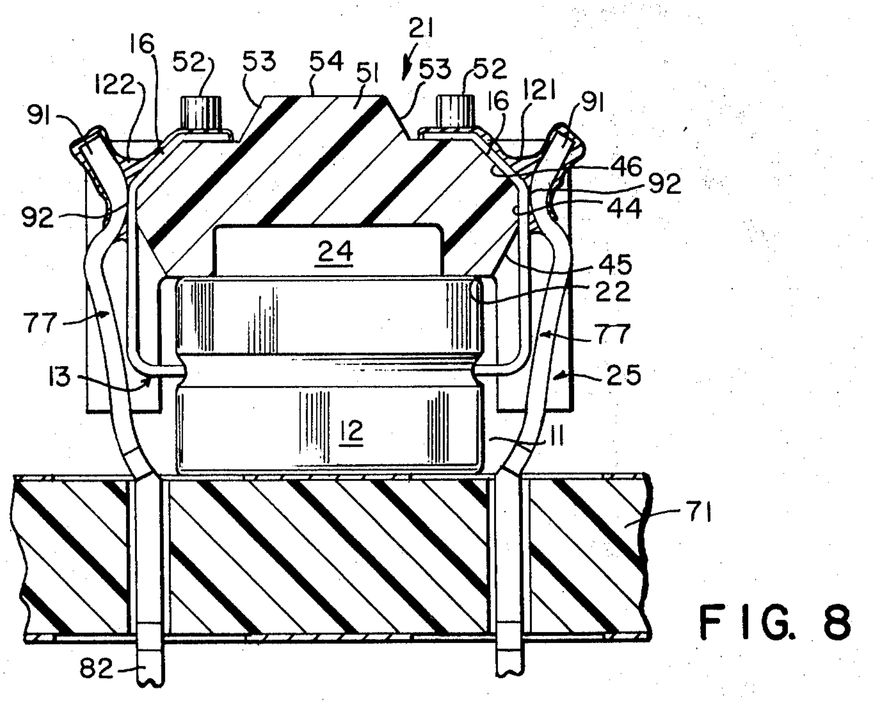
FIG. 8 is a cross-sectional view of the novel cartridge and integrated circuit assembly permanently attached to a panel of the type shown in FIG. 4.

The inner wall of the slots defined between each pair of adjacent posts 25 (and between each end lug 41 and its closely adjacent post 25) includes a small flat vertical face 44 disposed between a pair of inwardly turned flat faces 45 and 46 respectively (see FIGS. 7 and 8 for clearest detail of inner wall faces 44, 45 and 46).

The lower surface of the cartridge is best shown in the perspective view FIG. 3, and is seen to consist of an upstanding centrally disposed platform 51 surrounded by four integral upstanding circular feet 52 whose height from planar surface 37 equals the height of platform 51. As will be observed, the side wall 53 of platform 51 is tapered slightly while the end portion 54 of platform 51 are symmetrically curved, all for reasons which will be discussed below. Cartridge 21 contains a polarizing notch 55 which corresponds generally in size and purpose with notch 17 discussed earlier on integrated circuit package 11.

Having discussed the general configuration of the unitary mounting cartridge 21, its significance will now be considered with reference to the typical integrated circuit DIP 11 illustrated in FIGS. 1, 2 and 3. Cartridge 21 is arranged to smoothly and precisely receive integrated circuit package 11 in the manner shown in the two perspective views, FIGS. 2 and 3. In particular, when the DIP 11 is pushed into the cartridge 21, the lower surface of housing 12 rests securely upon flat shoulders 22-22 within the well-shaped region between posts 25, with polarizing notches 17 and 55 in alignment. It should be immediately apparent that the insertion of DIP 11 into cartridge 21 is greatly facilitates first by the rounded portions 26 of posts 25 and thereafter by the inwardly turned flat faces 45 which together provide a relatively wide easy "target" for entry of pins 16. The tapers defined in the spaces between posts 25 by flat faces 31 and 32 generally correspond in angle with tapered sections 15 of the ribbon leads 14 of DIP 11, and although different manufacturers may utilize different tapers 15, the angle selected for faces 31 and 32 is sufficiently wide to accommodate all of the known tapered leads used in the DIP manufacture. Also, as shown in FIGS. 2 and 3, the slots between posts 25 may accommodate leads of varying width, while the central opening between the two rows of posts 25 will accept DIP housings of different widths and lead heights.

As shown in FIGS. 2 and 3, when DIP 11 is fully inserted within the cartridge 21, the confronting face of reduced thickness portion 24 of the cartridge, in cooperation with the lower face of plastic package 12, defines a channel 58 of rectangular cross section which advantageously serves as a vent to enhance heat dissipation from DIP 11 when in operation. As noted best in FIGS. 2 and 3, after the DIP 11 has been inserted within cartridge 21, the outermost ends of leads 16 are each crimped over at 61 and 62, first against face 46 and then against planar surface 37, respectively. It will be observed that the thickness of ribbon leads 16 is less than the height previously specified for platform 51 and circular feet 52.

Reviewing the preceding discussion of FIGS. 1, 2 and 3, it may now be observed that cartridge 21 serves as an exceedingly convenient component for receiving and mounting a DIP integrated circuit. The two elements are readily assembled one to the other and since the correct ends of each component may be identified by the polarizing notches 17 and 55, assembly is rapid and may be performed by automatic machinery if desired. As is evident from FIG. 3, after the leads 16 have been crimped into place both the cartridge and the integrated circuit form a substantially rigid unitary assembly which may also be handled by automatic machinery without fear of separation or loss of components.

Having described the manner in which a dual-in-line package integrated circuit may be securely mounted upon a mating unitary plastic cartridge, the manner in which the combination may be used and the many advantages which flow therefrom will now be explored in further detail. In this connection reference is now made to FIG. 4 which illustrates in perspective a mounting panel upon which the cartridge mounted integrated circuit assembly may be attached for interconnection to external circuits in an appropriate manner. As shown, the mounting panel may consist of a printed circuit board formed of a relatively thin, flat fiberglass expoxy base 71 having metal foil conductive power and ground planes 72 and 73. In the conventional manner, these metallic planes have been etched to provide openings such as 74 and 75 into which parallel arrays of upstanding elongated conductive terminals 77 have been assembled to receive the integrated circuit and mounting cartridge assembly.

Turning first to the terminals themselves and the manner in which these are supported upon panel 71, each is seen to comprise an upper resilient portion 81 on the component side of the board, a short rectangular extension 82 which passes through board 71 and a depending, square cross-section wire wrap terminal 83 on the wiring side of the board, shown with typical wrapped leads 84 to indicate the manner of use. Each terminal member 77 is provided with a cross-member or shoulder 85, one of which as shown at 86 is electrically connected to conductive plane 72 for furnishing a power or a ground connection as the case may be. The entire terminal 77 is stamped and coined from a single piece of highly resilient metal such as phosphor bronze and may be gold-plated to enhance contact quality.

Figures 4, 4A, 5, 6:
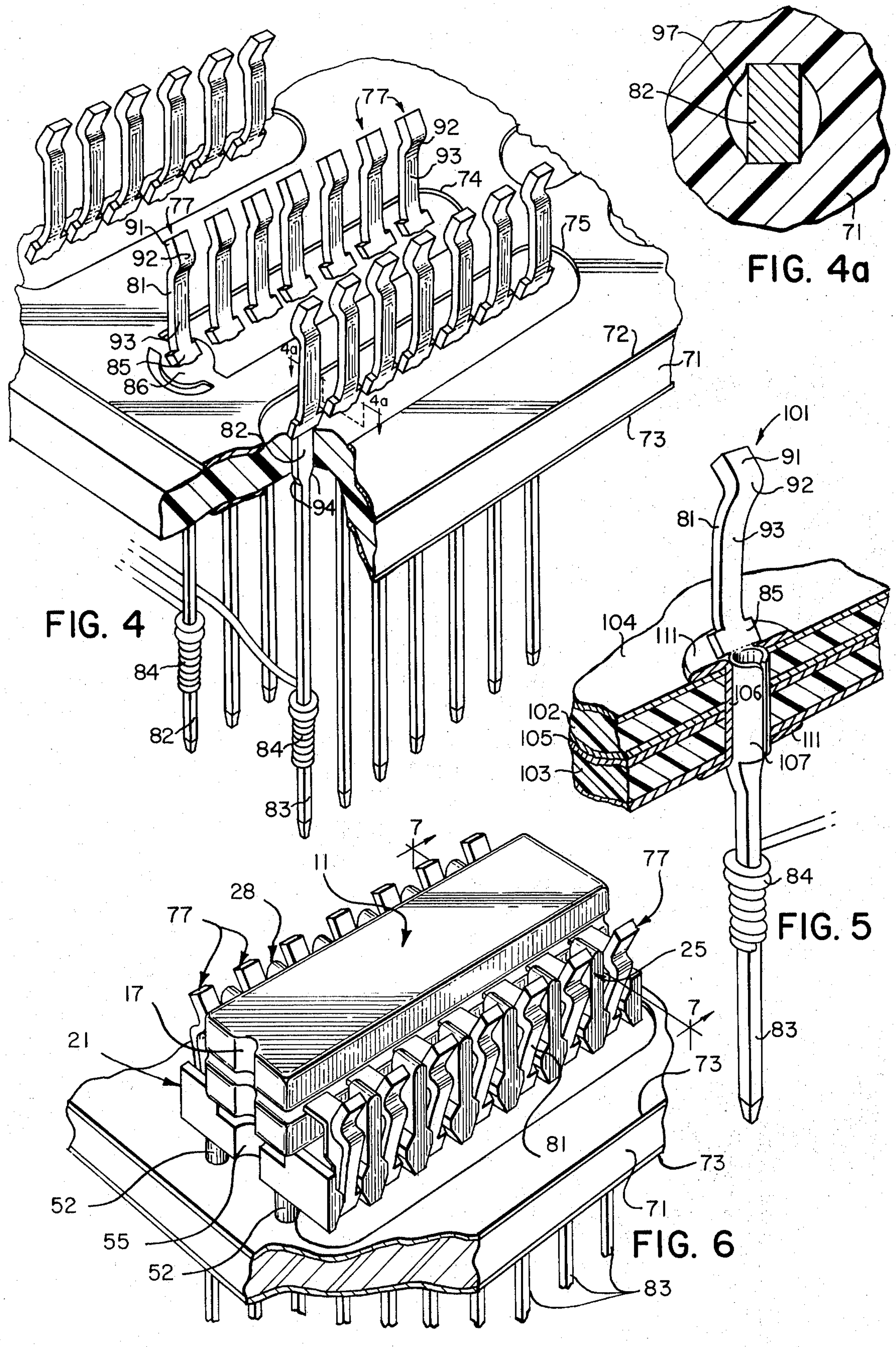
FIG. 4 is a perspective view, partially broken away, of a printed circuit board mounting panel illustrating an array of novel terminals adapted to receive the assembled cartridge and integrated circuit component shown in FIGS. 2 and 3, in a manner to be described.
FIG. 4A is a fragmentary, cross-sectional view of the novel terminal in the region where it passes through the mounting panel.
FIG. 5 is a perspective view, partially in section, illustrating an alternative terminal construction for use in the mounting panel shown in FIG. 4.
FIG. 6 is a perspective view illustrating the manner in which the cartridge and integrated circuit package assembly may be removably plugged into the mounting panel of FIG. 4.

Each terminal member 77 consists of an upper section 91 which is turned outwardly to provide a high point 92, which in turn is followed by an inwardly facing smoothly curved region 93 terminating in shoulder 85. Below the shoulder 85 the integral terminal member 77 is formed with a section of rectangular cross section as best illustrated in FIG. 4A which at a transition portion 94 continues into the square section wire wrap terminal 83. Each of the terminals 77 as shown in FIG. 4A is force fitted through a small round hole 97 in panel 71, and rectangular section 82 provides means for rigidly anchoring each terminal member 77 into the panel at the respective hole. By virtue of its "bite" in the panel 71, each terminal 77 is held against rotation within the opening.

As shown in FIG. 4, each of the terminal members 77 has been driven into its respective opening 97 until the lowermost portion of shoulder 85 abuts the upper surface of panel 71. Although the driving mechanism for each of the terminal members 77 has not been shown, cross member 85 provides a firm shoulder against which the driving tool may operate to set each of the terminal members into the board.

During manufacture, each of the terminal members is preferably stamped and coined from sheet stock to provide the configuration shown. It will be observed that the uppermost portions 91 of each of the terminal members 77 are of a thickness that is somewhat greater than the curved portion immediately below. In actual practice the terminals 77 are formed in a strip, each of which is connected to the one adjacent by means of a continuous band of metal (not shown) between adjacent portions 91. This permits handling of a large number of such terminals in rolls by automatic machinery and thus speeds assembly while reducing cost. As the terminals 77 are assembled, this continuous metal retaining strip is severed and removed in part to provide the free standing terminals, insulated one from the other. The spacing of terminals 77 within the panel 71 will be discussed below.

An alternative terminal 101 is illustrated in FIG. 5; however, in view of the great similarity to the terminal member 77, individual sections of the two terminals which are substantially the same, have been designated by identical reference numerals. The particular feature of terminal member 101 is its utility in multi-layer printed circuit board constructions. Thus insulative boards 102 and 103 having appropriate etched metal configurations such as 104, 105 and 106 are sandwiched together and a common opening 106 is provided through both boards for terminal 101. As shown in FIG. 5, a small resilient rolled cylindrical section 107 is provided below cross member 85 where the terminal member 101 passes through the two printed panels 102 and 103. A thin metallic layer 111 has been continuously plated through the mated openings in boards 102 and 103, and thus where desired will conductively contact metal layers 104, 105 and 106. The diameter of cylinder 107 is such as to require press fit into the openings shown. Cylinder 107 thus makes excellent conductive contact with plated metal 111 and the force fit precludes rotation or movement of terminal 101 in use. It should be observed that while terminal 101 has been shown in FIG. 5 as applied to multi-layer board construction, its use need not be so limited. Terminal 101 may be used also with boards as in FIG. 4, the axial length of cylinder 107 being appropriately related to board thickness.

Turning now to FIGS. 6 and 7, the assembly of integrated circuit 11 and cartridge 21 is shown plugged into and mechanically captivated within a corresponding array of terminals 77 on a mounting panel 71 for interconnection by wire wrap, as above described, to the remainder of the external system. To provide the assembly shown in FIGS. 6 and 7, the assembly shown in FIG. 2 is set down upon the upper portions 91 of the terminal members 77 and then pressed firmly to snap the combination into the position shown. As best illustrated in FIG. 7, the cartridge-DIP assembly fits securely between inwardly biased resilient terminal members 77 with positive electrical contact made in the region 115, the resilience of terminals 77 providing a firm retainer which precludes inadvertent or accidental withdrawal of the cartridge.

Observe in FIG. 7 that the outermost face of platform 51 rests securely against the upper face of mounting panel 71 while the small circular feet 52 contribute a firmer base which prevents rocking of the cartridge which might otherwise interfere with the quality of electrical contact. The crimped lead ends 16 do not contact the upper surface of panel 71.

It should be evident from FIGS. 6 and 7 that the integrated circuit and cartridge assembly, while plugged in, may be readily removed as a unitary assembly with a firm upward pull as, for example, by a typical integrated circuit removal tool. When pulled upwardly, the cartridge and integrated circuit assembly will cause the upper portions 91 of terminal members 77 to bend and permit release of the assembly. The cartridge and integrated circuit assembly may thus be removed and reinserted as will without separating one from the other. Each time that the cartridge is inserted, good electrical contact will be made between the outer surface of each of the ribbon leads 13 of the integrated circuit 11 and the respective resilient terminal 77.

Certain other important advantages of this removable, plugged in, condition of the assembled cartridge and associated integrated circuit should be noted. With reference to FIG. 7, it is seen that the confronting uppermost portions 91 of terminals 77 are turned outwardly, thus providing a relatively large "target" entry area for the insertion of the assembled combination. This not only facilitates manual insertion, but also permits automatic machine loading of the components on panels without risk of damage to the components being inserted. Also, in the removable position shown in FIGS. 6 and 7, the terminals 77 have been resiliently bent open and are thus normally urged together. This provides firm electrical contact at areas 115 at all times, and enhances the dissipation of head from leads 13 to the environment through terminals 77. Examination of the relationship of leads 13 and terminals 77 in FIG. 7 reveals another advantage; namely that the terminals will accommodate integrated circuits and the associated cartridges despite type variations and different tolerances of the several integrated circuit manufacturers. Thus terminals 77 will mechanically captivate and electrically contact leads 13 of integrated circuit 11 even if the transverse lead 13 spacing is somewhat increased or decreased, and even if the plane in which leads 13 emerge from the housing 12 is somewhat raised or lowered.

The utility of the assembled cartridge integrated circuit combination shown in FIGS. 2 and 3 is not limited to application in the removable condition shown in FIGS. 6 and 7. Turning to FIG. 8, a permanent installation of an integrated circuit or DIP 11 is illustrated. In FIG. 8 the very same cartridge and integrated circuit assembly has been inserted in inverted fashion in the identical array of terminals 77. Integrated circuit 11 rests firmly against the upper face 72 of mounting panel 71, with protrusions 92 resiliently engaging the integrated circuit lead sections 16, for firm electrical contact and mechanical retention. In the manner illustrated, each of the terminals 77 is soldered to the respective integrated circuit ribbon lead sections 16 as at 121 and 122. Soldering may of course be performed manually, but preferably wave soldering techniques are used. In performing the latter operation, the mounting panel shown in FIG. 8 with the integrated circuit and cartridge assemblies in the position shown, is inverted and wave soldered with the solder level reaching slightly beyond the area of contact with protrusions 92. During the soldering operation, the body of cartridge 21 functions as a shield, minimizing the heat which reaches integrated circuit 11 and the sensitive electronic elements therein.

In the course of the wave soldering operation, which requires essentially that the combination shown in FIG. 8 be inverted, platform 51 described in detail in connection with FIG. 3 serves to direct solder flow into the region of the contact areas between each terminal 77 and each lead section 16. This yields consistently uniform and electrically acceptable solder joints. Once soldered, the cartridge combination shown in FIG. 8 can withstand the most severe environmental conditions without contact "noise" or the danger that any one of the many circuits which may be made on a single mounting panel will open. Although normally intended for permanent installation, an integrated circuit soldered as shown in FIG. 8 may, should the occasion arise, be removed for replacement. Soldering tools are available which simultaneously heat and loosen the solder on each of the terminals of the integrated circuit while providing upward motion so that the cartridge and integrated circuit may be withdrawn as an assembly with comparative ease.

By comparison with prior soldered DIP panels, the permanent installation techniques shown in FIG. 8 offer numerous advantages leading to lower total cost and improved manufacturing procedures. Customarily, large numbers of integrated circuits are assembled on a single mounting panel and wire wrapped by machine in the manner specified by the circuit designer. In the past, after wiring and after the DIP's had been assembled and soldered in place, the panel was tested and defective integrated circuits replaced. With reference to FIG. 8, it is clear that the individual integrated circuit and cartridge assemblies may be placed in position on the mounting panel, then tested, and defects may be replaced before wave soldering. Terminals 77 as in FIG. 8 offer sufficiently good electrical contact before soldering to permit effective test; replacements may be made and the system rechecked; then all DIP's may be wave soldered into permanent electrical and mechanical contact.

With reference to FIGS. 4, 7 and 8, it should be observed that terminals 77 captivate the assembled cartridge and integrated circuit by engaging the outer surfaces of the ribbon leads 13 on the component side of panel 71. However, as is clear from these figures each terminal 77 is provided with an offset whereby the center-to-center transverse spacing of the wire wrap terminals 83 is equal to the spacing previously employed for plug-in lead socket constructions. In practical application, the holes 97 in panel 71 may be drilled with centers on a 0.100 inch grid, as before, to enable the use of prior programs for wire wrapping terminals 83, as required.

Certain other aspects of the invention merit discussion here. When made in large multi-cavity molds, the cartridges are exceedingly low cost and may be attached by the integrated circuit manufacturer in the manner shown in FIGS. 1 and 2 as a support for each component made. Although this will represent some cost increase at the source. an immediate benefit is that the DIP leads in cartridges as shown are fully protected against bending and other damage. Component assemblies, such as in FIGS. 2 and 3, may simply be packed and shipped in bulk without additional lead protection, and at the user's facility loaded in bulk into machine feeders for automatic plugging into panels of the type shown in FIG. 4.

As noted earlier herein, the manufacture of an integrated circuit involves the molding of an insulated housing such as 12 in FIG. 1. It is within the purview of the present invention to mold a unitary, integral assembly having the configuration generally shown in FIGS. 2 and 3, effectively combining into one step the encapsulation of the electronic solid state device and the molding of cartridge 21. In essence, the product of the DIP manufacturer contemplated herein is substantially as in FIGS. 2 and 3 except that insulated housing 12 and cartridge 24 are integral and molded as one. By this technique the cost of separate molding and assembly of two elements are reduced to the cost of a single plastic molding operation.

By virtue of the foregoing, various other uses and applications of the novel component mounting techniques described herein, including the novel integrated circuit cartridge, the integrated circuit cartridge and assembly, and the mounting panel and associated novel terminals, will become obvious to those skilled in the art, particularly insofar as these techniques are applicable to other electrical and electronic components. Accordingly, the scope of the present invention is to be construed only by the appended claims.

We claim:

1. An insulative cartridge for retaining an integrated circuit package in a unitary assembly selectively adapted to be removably plugged or permanently soldered into a pair of parallel rows of upstanding electrical terminals, said integrated circuit package includes a generally flat rectangular housing with two substantially parallel rows of conductive leads respectively extending outwardly from a pair of opposite parallel edges of said housing and turned at right angles to the flat surface of said housing to protrude beyond one flat surface thereof, said leads tapering symmetrically to a reduced width at their respective ends, said insulative cartridge comprising:

a generally flat rectangular body portion;

a pair of spaced parallel rows of upstanding posts integral with said body portion and disposed along a pair of opposite parallel edges thereof; and at least one raised integral projection inward of said upstanding posts extending from the lower surface of said body portion a distance which is greater than the thickness of the conductive leads of an integrated circuit package as aforesaid;

said integral posts extending upwardly beyond the upper surface of said body portion and defining thereby a central well-shaped region between said rows of upstanding posts, said central well-shaped region including a portion of reduced thickness which forms a generally rectangular longitudinal channel narrower than the space between said rows of posts and substantially parallel to each of said rows, said channel thereby defining a pair of shoulders located between each row of integral posts and said channel, said well-shaped region being shaped to receive and accommodate said integrated circuit package rectangular housing in contact with the top surfaces of said shoulders and closely confined by said upstanding posts, said channel remaining open for free flow of air, said posts extending upwardly between and beyond said right angle in the conductive leads of an integrated circuit as aforesaid when said integrated circuit housing rests upon said shoulders with the conductive leads extending downwardly toward the lower surface of said cartridge;

said posts further defining a plurality of generally parallel slots extending upwardly from said lower surface of said body portion;

the configuration of said body portion edges defining the inner contours of each of said slots is formed with faces sloping inwardly to both lower and upper surfaces of said body portion, said inner contours having a face substantially parallel to said posts disposed between said two sloping surfaces;

said integral posts each having lower ends which are coextensive with said body portion lower surface, and having smoothly rounded upper ends, each post being formed with a section of increased thickness having faces sloping from the normal thickness of said posts to the area of increased thickness and a face substantially parallel to said posts disposed between said two sloping surfaces, said parallel and sloping surfaces on said posts being adjacent respective parallel and sloping surfaces on said body portion, the narrowed slots between said posts being thus shaped to receive the reduced width portion of said leads while the wider portion of said leads fits in the full width of said slots.

2. An insulative cartridge for retaining an integrated circuit package in a unitary assembly selectively adapted to be removably plugged or permanently soldered into a pair of parallel rows of upstanding electrical terminals, said integrated circuit package includes a generally flat rectangular housing with two substantially parallel rows of conductive leads respectively extending outwardly from a pair of opposite parallel edges of said housing and turned at right angles to the flat surface of said housing to protrude beyond one flat surface thereof, said leads tapering symmetrically to a reduced width at their respective ends, said insulative cartridge comprising:

a generally flat rectangular body portion;

a pair of spaced parallel rows of upstanding posts integral with said body portion and disposed along a pair of opposite parallel edges thereof; and at least one raised integral projection located inwardly of said opposite parallel edges and extending from the lower surface of said body portion a distance which is greater than the thickness of said conductive leads of said integrated circuit package;

said integral posts extending upwardly beyond the upper surface of said body portion and defining thereby a central well-shaped region between said rows of upstanding posts, said well-shaped region being shaped to receive and accommodate said integrated circuit package rectangular housing in contact with the top surfaces of said body portion, said upstanding posts being spaced to closely confine said integrated circuit package therebetween;

said posts further defining a plurality of generally parallel slots extending upwardly from said lower surface of said body portion, said slots being adapted to receive said conductive leads along said edges of said body portion;

said body portion within each of said slots being formed with a face sloping inwardly to said body portion lower surface and a face sloping inwardly toward said body portion upper surface;

said body portion being formed with a longitudinal area of reduced thickness extending into the upper surface thereof and disposed substantially parallel to said rows of integral posts, said reduced thickness portion extending the length of said body portion and opening into the parallel edges thereof unoccupied by said posts;

each of said integral posts is smoothly rounded at its uppermost end and is flat and so-extensive with said body portion lower surface at its opposite end.

3. An insulative cartridge as in claim 2, wherein:
each of said integral posts in the region of said body portion is formed with a section of increased thickness, thereby reducing the width of a region of each of said slots between confronting faces of adjacent ones of said posts and between said body portion upper and lower surfaces.

4. An insulative cartridge for retaining an integrated circuit package in a unitary assembly selectively adapted to be removably plugged or permanently soldered into a pair of parallel rows of upstanding electrical terminals, said integrated circuit package includes a generally flat rectangular housing with two substantially parallel rows of conductive leads respectively extending outwardly from a pair of opposite parallel edges of said housing and turned at right angles to the flat surface of said housing to protrude beyond one flat surface thereof, said leads tapering symmetrically to a reduced width at their respective ends, said insulative cartridge comprising:
a generally flat rectangular body portion;
a pair of spaced parallel rows of upstanding posts integral with said body portion and disposed along a pair of opposite parallel edges thereof; and
at least one raised integral projection located inwardly of said opposite parallel edges and extending from the lower surface of said body portion a distance which is greater than the thickness of said conductive leads of said integrated circuit package;

said integral posts extending upwardly beyond the upper surface of said body portion and defining thereby a central well-shaped region between said rows of upstanding posts, said well-shaped region being shaped to receive and accommodate said integrated circuit package rectangular housing in contact with the top surfaces of said body portion, said upstanding posts being spaced to closely confine said integrated circuit package therebetween;

said posts further defining a plurality of generally parallel slots extending upwardly from said lower surface of said body portion, said slots being adapted to receive said conductive leads along said edges of said body portion;
said central well-shaped region including a reduced thickness portion formed as a generally rectangular longitudinal channel substantially narrower than the spacing between said rows of posts and substantially parallel to each of said rows, said reduced thickness portion thereby defining a pair of shoulders located on said body portion between each row of integral posts and said reduced thickness portion, said reduced thickness portion remaining open for free flow of air during use of said cartridge, said posts extending upwardly between and beyond the right angle turns of an integrated circuit as aforesaid when said integrated circuit housing rests upon said shoulders with the integrated circuit leads extending downwardly toward the lower surface of said cartridge in said slots;
the configuration of said body portion edges defining the inner contours of each of said slots is formed with face sloping inwardly to both lower and upper surfaces of said body portion, said inner contours having a face substantially parallel to said posts disposed between said two sloping surfaces;
said integral posts each having lower ends which are co-extensive with said body portion lower surface and each having smoothly rounded upper ends, each post being formed with a section of increased thickness having faces sloping from the normal thickness of said posts to the area of increased thickness and a face substantially parallel to said posts disposed between said two sloping surfaces, said parallel and sloping surfaces on said posts being adjacent respective parallel and sloping surfaces on said body portion, the narrow slots between said posts being thus shaped to receive the reduced width portion of the leads of an integrated circuit as aforesaid while the wider portions of the integrated circuit leads fit in the full width areas of said slots.

5. An insulative cartridge for retaining an integrated circuit package in a unitary assembly selectively adapted to be removably plugged or permanently soldered into a pair of parallel rows of upstanding electrical terminals, said integrated circuit package includes a generally flat rectangular housing with two substantially parallel rows of conductive leads respectively extending outwardly from a pair of opposite parallel edges of said housing and turned at right angles to the flat surface of said housing to protrude beyond one flat surface thereof, said leads tapering symmetrically to a reduced width at their respective ends, said insulative cartridge comprising:
a generally flat rectangular body portion;
a pair of spaced parallel rows of upstandng posts integral with said body portion and disposed along a pair of opposite parallel edges thereof; and
at least one raised integral projection located inwardly of said opposite parallel edges and extending from the lower surface of said body portion a distance which is greater than the thickness of said conductive leads of said integrated circuit package;

said integral posts extending upwardly beyond the upper surface of said body portion, the confronting surfaces of said opposite rows of posts being substantially parallel, thereby defining a central well-shaped region having a generally rectangular cross section between said rows of upstanding posts, said well-shaped region being open-ended and extending uninterrupted between the opposite edges of said body portion which do not include said integral posts;
adjacent ones of said posts further defining generally parallel slots extending upwardly from said lower surface of said body portion, said slots being adapted to receive the conductive leads of an integrated circuit package as aforesaid along said edges of said body portion when the housing of said integrated circuit package rests upon said upper surface of said body portion;
said integral posts are co-extensive at their lower ends with said lower surface of said body, each post being formed with a section of increased thickness in the vicinity of said body portion thereby defining slots between said posts having an upper section of a width to receive the main width of said conductive leads of said integrated circuit package and a narrower lower slot section to receive the reduced width portion of said conductive leads.

6. An insulative cartridge as in claim 5 wherein the spacing between said rows of posts is substantially equal to the width of an integrated circuit package housing as aforesaid.

7. An insulative cartridge as in claim 5 wherein said central well-shaped region includes a portion of reduced thickness forming a rectangular longitudinal channel substantially narrower than the spacing between said rows of posts and substantially parallel to both of said rows, said channel thereby defining a pair of shoulders located between each row of integral posts and said channel, said shoulders being adapted to support the housing of an integrated circuit as aforesaid.

8. An insulative cartridge for retaining an integrated circuit package in a unitary assembly selectively adapted to be removably plugged or permanently soldered into a pair of parallel rows of upstanding electrical terminals, said integrated circuit package includes a generally flat rectangular housing with two substantially parallel rows of conductive leads respectively extending outwardly from a pair of opposite parallel edges of said housing and turned at right angles to the flat surface of said housing to protrude beyond one flat surface thereof, said leads tapering symmetrically to a reduced width at their respective ends, said insulative cartridge comprising:

a generally flat rectangular body portion; and a pair of spaced parallel rows of upstanding posts integral with said body portion and disposed along a pair of opposite parallel edges thereof;

said integral posts extending upwardly beyond the upper surface of said body portion, the confronting surfaces of said opposite rows of posts being substantially parallel, thereby defining a central well-shaped region having a generally rectangular cross section between said rows of upstanding posts, said well-shaped region being open-ended and extending uninterrupted between the opposite edges of said body portion which do not include said integral posts;

adjacent ones of said posts further defining generally parallel slots extending upwardly from said lower surface of said body portion, said slots being adapted to receive the conductive leads of an integrated circuit package as aforesaid along said edges of said body portion when the housing of said integrated circuit package rests upon said upper surface of said body portion;

said integral posts being co-extensive at their lower ends with said lower surface of said body, each post being formed with a section of increased thickness in the vicinity of said body portion thereby defining slots between said posts having an upper section of a width to receive the main width of said conductive leads of said integrated circuit package and a narrower lower slot section to receive the reduced width portion of said conductive leads;

said central well-shaped region including a portion of reduced thickness forming a rectangular longitudinal channel substantially narrower than the spacing between said rows of posts and substantially parallel to both of said rows, said channel thereby defining a pair of shoulders located between each row of integral posts and said channel, said shoulders being adapted to support the housing of an integrated circuit as aforesaid.

9. A unitary electronic integrated circuit assembly comprising:

an integrated circuit package comprising:

a generally flat rectangular housing; and two parallel rows of conductive leads extending from a pair of oppositely disposed parallel edges thereof and turned at right angles to the flat surface of said housing; and an insulative cartridge comprising:

a generally flat rectangular body portion; and a pair of spaced parallel rows of upstanding posts integral with said body portion and disposed along a pair of opposite parallel edges thereof;

said integral posts extending upwardly beyond the upper surface of said body portion and defining therewith an open-ended generally rectangular central well-shaped region adjacent ones of said posts further defining generally parallel slots extending upwardly from the lower surface of said body portion;

said integrated circuit package being closely confined within said well-shaped region between said pair of rows of posts, said conductive leads located within respective ones of said slots and extending downward toward and turned inwardly over said lower surface of said body portion, said posts extending upwardly between and beyond said right angle turns of said conductive leads.

10. A unitary electronic integrated circuit assembly as in claim 9 wherein said integral posts are co-extensive at their lower ends with said lower surface of said body, each post being formed with a section of increased thickness in the vicinity of said body portion thereby defining slots between said posts having an upper section of a width corresponding to the main width of said conductive leads of said integrated circuit package and a narrower lower slot section corresponding to the reduced width portion of said conductive leads.

* * * * *